United States Patent
Xu

(10) Patent No.: US 9,054,648 B1
(45) Date of Patent: Jun. 9, 2015

(54) WIDEBAND ACTIVE BALUN LNA TOPOLOGY WITH NARROW-BAND FILTERING AND NOISE CANCELLING

(71) Applicants: MONTAGE TECHNOLOGY (SHANGHAI) CO., LTD., Shanghai (CN); SUZHOU MONTAGE MICROELECTRONIC TECHNOLOGY CO., LTD., Suzhou, Jiangsu (CN)

(72) Inventor: Jun Xu, Shanghai (CN)

(73) Assignees: MONTAGE TECHNOLOGY (SHANGHAI) CO., LTD., Shanghai (CN); SUZHOU MONTAGE MICROELECTRONIC TECHNOLOGY CO., LTD., Suzhou, Jiangsu (CN)

( * ) Notice: Subject to any disclaimer, the term of this patent is extended or adjusted under 35 U.S.C. 154(b) by 0 days.

(21) Appl. No.: 14/102,424

(22) Filed: Dec. 10, 2013

(51) Int. Cl.
*H03F 1/26* (2006.01)
*H03F 3/19* (2006.01)
*H03F 3/45* (2006.01)

(52) U.S. Cl.
CPC .. *H03F 1/26* (2013.01); *H03F 3/19* (2013.01); *H03F 3/45071* (2013.01); *H03F 2003/45008* (2013.01); *H03F 2200/451* (2013.01); *H03F 2200/294* (2013.01); *H03F 2200/372* (2013.01); *H03F 2203/45051* (2013.01)

(58) Field of Classification Search
CPC .......... H03F 2200/294; H03F 3/45475; H03F 3/45179; H03F 3/195; H03F 1/26; H03F 3/211; H03F 2200/372; H03F 2203/45138; H03F 3/193; H03F 3/45183; H03F 1/223; H03F 2200/451; H03F 2203/45288
USPC ............ 330/85, 116, 117, 253, 260, 275, 301
See application file for complete search history.

(56) References Cited

U.S. PATENT DOCUMENTS 8,587,381 B1 * 11/2013 Manstretta et al. ........... 330/301

* cited by examiner

*Primary Examiner* — Khanh V Nguyen
(74) *Attorney, Agent, or Firm* — Tianhua Gu; Global IP Service

(57) ABSTRACT

The present invention provides a wideband active balun LNA topology with narrow-band filtering and noise cancelling. The amplifier includes three transconductance stages, a feedback network, and a load. The first and second transconductance stages are connected in parallel to receive the input signal. The differential output of the first transconductance stage is fed back to voltage input through a differential-to-single-end-end feedback network, while the output of the first transconductance, passing through the third transconductance, is added to the output of the second transconductance stage in proper phase. The present invention accomplish both wideband low-noise amplification and narrow-band filtering without inserting interface stages, thereby improving the linearity and noise performance of the whole circuit. Noise cancellation technique is implemented in differential way to ensure the low noise figure. The present invention also achieves single-end to differential conversion with balanced output and superior second order linearity performance.

7 Claims, 3 Drawing Sheets

WIDEBAND ACTIVE BALUN LNA TOPOLOGY WITH NARROW-BAND FILTERING AND NOISE CANCELLING

BACKGROUND OF THE PRESENT INVENTION

1. Field of Invention

The present invention relates to the field of communication system, specifically to a low-noise amplifier (LNA), and more specifically to a wideband active balun LNA topology with narrow-band filtering and noise cancelling.

2. Description of Related Arts

Besides the basic requirements of low-noise amplification and impedance matching, the RF input front end of a wideband receiver is desired to be capable of handling tracking filtering and single-to-differential (S-to-D) conversion with stable second-order linearity and lower power consumption. In order to achieve such requirements, a general approach is as follows: RF signals passing through S-to-D network or LNA, and then being connected to a filter load through a buffer stage and a transconductance (Gm) stage to accomplish narrow-band tracking filtering, and then being connected to a mixer through the buffer stage. The buffer stage and the transconductance (Gm) stage that serve as interface stages consume a substantial sum of power and use more chip-area and also limit the overall linearity and noise performance. The structures that are generally used in wideband LNA are analyzed below.

Traditional wideband low-noise amplifier structures usually have a single-end input and output.

The simplest structure as above described is common-gate (CG) or common-source (CS) single-transistor amplification. The structure with common-source and input parallel resistor matching is very simple, but still commonly used. The disadvantage of such structure is that it is impossible to achieve low noise and impedance matching simultaneously.

Besides single-transistor amplifier and simple feedback amplifier, many wideband low-noise amplifier structures adopt a noise cancellation technology to achieve lower noise figure as well as achieving source impedance matching. For example, F. Bruccoleri published the paper entitled "Wide-Band CMOS Low-Noise Amplifier Exploiting Thermal Noise Cancelling" on IEEE JSSC in 2004, in which the proposed structure implements noise cancellation of the transistor dedicated for impedance matching. Later, a similar structure was applied to a digital TV Tuner chip. For example, Gupta, M. published the paper entitled "A 48 to 860 MHz CMOS Direct-Conversion TV Tuner" on IEEE ISSCC in 2007, in which a similar structure is used. However, the disadvantage of such a structure is poor IIP2. The paper entitled "A Wideband CMOS Low-noise amplifier Employing Noise and IM2 Distortion Cancellation for a Digital TV Tuner" published on IEEE JSSC in 2009 by Donggu Im mentioned a method of CMOS and current mirror, which can achieve noise cancellation and further improve IIP2 of a single-ended input and single-end output low-noise amplifier (LNA) to some extent. However, this structure has some drawbacks as follows: a current mirror limits the bandwidth of the circuit and the current mirror itself introduces much noise whereas second-order linearity basically depends on the matching between PMOS and NMOS, which can result in a relatively sensitive IIP2. The wideband low-noise amplifier structures introduced above are capable of implementing a relatively low noise figure, however, they can't satisfy the requirement of single-to-differential conversion on a chip, and it is difficult for them to attain good second-order linearity either.

However, only a small number of LNA structures can obtain single-to-differential conversion in a wide bandwidth. For example, Blaakmeer, S. C. published the paper entitled "Wideband Balun-LNA With Simultaneous Output Balancing, Noise-Cancelling and Distortion-Cancelling" on IEEE JSSC in 2008, which proposed a single-ended input, differential output and noise-cancelling amplifier (LNA) structure that is capable of cancelling the noise of the common-gate transistor dedicated for input impedance matching. However, in order to obtain a balanced differential voltage output, the output load resistances of two differential signals should be different from each other. Therefore, a load filter circuit similar to LC Tank cannot be directly connected to the output thereof. In view of implementing filtering, a stage such as transconductance stage (Gm) or buffer stage must be inserted between the LNA and the filter load (similar to the foregoing traditional approach), which simultaneously degrades noise performance and linearity performance, thereby further adding extra power consumption. For example, Ru, Z. published the paper entitled "A 300-800 MHz Tunable Filter and Linearized LNA Applied in a Low-Noise Harmonic-Rejection RF-Sampling Receiver" on IEEE JSSC in 2010, which proposed a single-to-differential conversion structure using cascaded inverting CMOS stages. Although the structure can implement single-to-differential conversion on a chip, a filter circuit is placed at an RF input since it can't be implemented at output, resulting in a very narrow input matching bandwidth. Furthermore, this structure can obtain good IIP3 using a post-linearization approach, however the relatively good IIP2 is sensitive, which essentially relies on the matching between PMOS and NMOS. In addition, the noise figure of the entire circuit is relatively high without using noise cancellation technology. For example, Donggu Im published the paper entitled "A CMOS Active Feedback Balun-LNA with High IIP2 for Wideband Digital TV Receivers" on IEEE Transactions on Microwave Theory and Techniques in 2010, which proposed a structure of implementing single-to-differential conversion through differential pair and also implementing wideband matching with a differential-to-single-end feedback. So the structure has very stable IIP2 and a highly symmetrical differential output. The disadvantage is that the output impedance characteristic directly affects the input matching, thus failing to implement low-noise amplification and narrow-band filtering in one stage, if additional transconductance stage is inserted for filtering, the overall noise and linearity performance will be degraded. For example, Pui-In Mak published the paper entitled "A 0.46-mm2 4-dB NF Unified Receiver Front-End for Full-Band Mobile TV in 65-nm CMOS" on IEEE JSSC in 2011, which proposed a noise cancellation circuit based on Nauta's scheme. This circuit can achieve balanced differential output and implement relatively good single-to-differential conversion by turning a part of transconductance from DC connection into AC connection, and inserting a multi-stage differential current balancer (DCB) circuit. Besides, the structure can be directly connected to LC narrow-band filter at output due to the same output load for differential path. The disadvantage of this structure is that: balanced differential output is implemented through a multi-stage DCB circuit, which is therefore constrained by both the voltage headroom of the circuit and the adjustability capability of the DCB circuit. When the DCB circuit is well designed to meet the requirement of differential balancing, the input part of the circuit still encounters the trade-off between a noise figure and impedance matching. In addition, IIP2 performance of the circuit is still sensitive and is easily susceptible to the power supply, load, and performance of DCB circuit. For example, Danilo Manstretta published the paper entitled "A Broadband Low-Power Low-Noise Active Balun with Second-Order Distortion Cancellation" on IEEE JSSC in 2012, which proposed, based on the noise cancellation circuit of Nauta's Group, a single-to-differential conversion structure that increases second-order linearity by adopting a common-mode feedback circuit. Although the structure can implement desirable IIP2 and NF, the unbalanced differential output makes it impossible for a load filter circuit similar to LC Tank to be implemented, unless an additional buffer stage or transconductance (Gm) stage is used.

In previous realization, none of the existing manners for wideband LNA structure is found capable of implementing single-to-differential conversion, narrow-band LC filtering, low noise and stable second-order linearity simultaneously in one stage.

SUMMARY OF THE INVENTION

For the above disadvantage in the prior art, the present invention provides a wideband active balun LNA topology with narrow-band filtering and noise cancelling, to solve the problem in the prior art that the traditional wideband low-noise amplifier structure does not have a narrow-band filtering and is unable to achieve desirable linearity performance, noise performance, and impedance matching performance simultaneously.

In order to realize the described functions, the present invention provides a wideband active balun LNA topology with narrow-band filtering and noise cancelling. The wideband active Balun low-noise amplifier topology comprises: a first transconductance stage, a second transconductance stage, a third transconductance stage, a feedback network, and a first load;

for the first transconductance stage and the second transconductance stage, the first transconductance stage is in parallel to the second transconductance stage, a single-end input of the first transconductance stage connects to a voltage input, a first output of the first transconductance stage connects to a first input of the third transconductance stage, and a second output of the first transconductance stage connects to a second input of the third transconductance stage; a single-end input of the second transconductance stage connects to the voltage input, a first output of the second transconductance stage connects to a first output of the third transconductance stage, a second output of the second transconductance stage connects to a second output of the third transconductance stage; the first transconductance stage and the second transconductance stage are used to input voltages;

for the feedback network, an output of the feedback network connects to the voltage input, a first input of the feedback network connects to the second output of the first transconductance stage, a second input of the feedback network connects to the first output of the first transconductance stage; and the feedback network is used to convert differential output signal of the first transconductance stage into a single-end signal, and feeds it back to the single-end voltage input to form a feedback loop;

for the third transconductance stage, the first input of the third transconductance stage connects to the first output of the first transconductance stage, the second input of the third transconductance stage connects to the second output of the first transconductance stage, the first output of the third transconductance stage connects to the first output of the second transconductance stage, the second output of the third transconductance stage connects to the second output of the second transconductance stage; and the third transconductance stage is used to convert a voltage output by the first transconductance stage into a current, and this current will be added to the current output by the second transconductance stage;

for the first load, one end of the first load connects to the first output of the third transconductance stage, another end of the first load connects to the second output of the third transconductance stage; and the first load is used to receive the summed current from the third transconductance stage and the second transconductance stage, and generate a narrow-band differential voltage signal.

Preferably, the feedback network comprises a second load, a feedback resistor, and a feedback amplifier.

Preferably, one end of the feedback resistor connects to the voltage input, and another end of the feedback resistor connects to an output of the feedback amplifier.

Preferably, a first input of the feedback amplifier connects to one end of the second load, and a second input of the feedback amplifier connects to another end of the second load.

Preferably, a voltage signal generated on the second load by the first transconductance stage is fed back to the voltage input via the feedback amplifier and the feedback resistor.

Preferably, the first load is a passive narrow-band filter circuit or a frequency-dependent load circuit.

Preferably, the output noise generated by the first transconductance stage is transferred to the output by two paths. One is from the output of the first transconductance, passing through the third transconductance to the output, the other is from the output of the first transconductance, passing through the feedback network and the second transconductance successively to the output. The phase shift of these two paths is just opposite from each other, making it possible to cancel the noise of the first transconductance.

As discussed above, the wideband active balun LNA topology with narrow-band filtering and noise cancelling of the present invention has the following beneficial effects:

1. The circuit proposed in the present invention implements wideband low-noise amplification and LC narrow-band filtering without inserting any additional buffer stage or transconductance (Gm) stage between the LNA and the filter load, thereby effectively improving the linearity performance and noise performance of the entire circuit.

2. The present invention implements single-to-differential conversion with balanced differential signal output and superior IIP2 performance.

3. Due to the noise cancellation technology adopted in the present invention, noise from those transistors that work for impedance matching can be eliminated, thus achieving wonderful low noise performance.

REFERENCE NUMERALS

Figure 1:
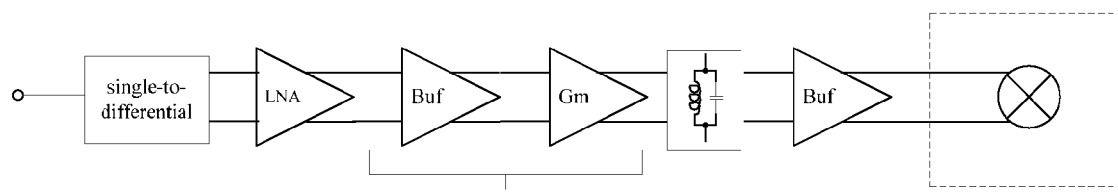
FIG. 1 shows a circuit schematic of a circuit for implementing narrow-band filtering of a common wideband low-noise amplifier.

1 First transconductance stage
2 Second transconductance stage
3 Third transconductance stage
4 Feedback network
5, 41 Load
42 Feedback resistor
43 Feedback amplifier

DETAILED DESCRIPTION OF THE PREFERRED EMBODIMENTS

The implementation of the present invention is described below through specific embodiments, and a person skilled in the art could easily understand other advantages and efficacy of the present invention according to the disclosure of the specification. The present invention can also be implemented or applied in other specific implementations. Based on different perspectives and applications, various modifications or alterations may be made to the details of the specification without departing from the concept of the present invention.

Before detailed description about the present invention with reference to the accompanying drawings, it should be noted that the drawings provided in this embodiment are merely used to illustrate the basic idea of the present invention in a schematic way; therefore, the drawings only show related components of the present invention and are not drawn in accordance with the number, shapes, and sizes of the components during practical implementation. The pattern, number, and proportion of the components during practical application may be changed randomly, and the layout pattern of the components may be more complex.

The embodiments of the present invention are described in detail below with reference to the accompanying drawings.

FIG. 1 shows a traditional wideband low-noise amplifier that can achieve narrow-band filtering. An RF signal passes through a network of single-to-differential conversion or a low-noise amplifier and connects to a filter load through a buffer stage and a transconductance (Gm) stage to accomplish narrow-band filtering, and is then connected to a mixer through a buffer stage. The buffer stage and the transconductance (Gm) stage that serve as interface stages consume a substantial sum of power and die area and also limit overall linearity and noise performance of the system.

Figure 2:
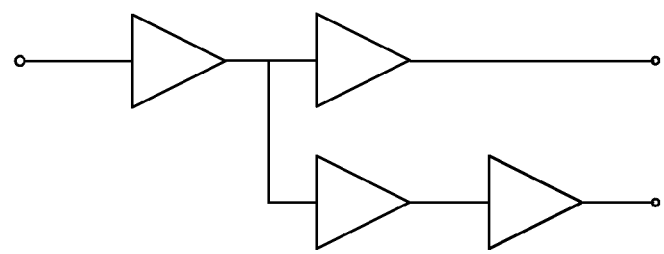
FIG. 2 shows a circuit schematic of a single-to-differential conversion circuit of a topology A.
Figure 3:
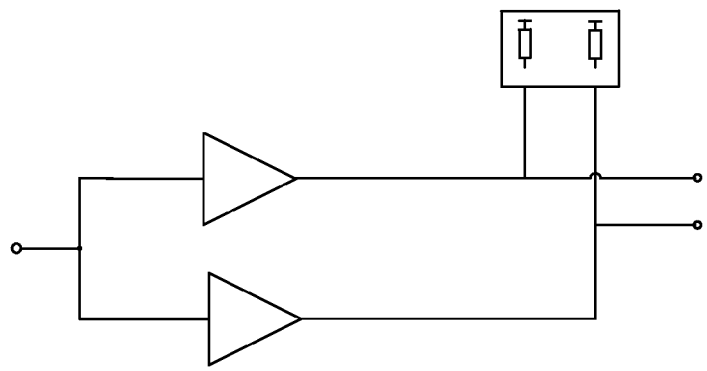
FIG. 3 shows a circuit schematic of a single-to-differential conversion circuit of a topology B.
Figure 4:
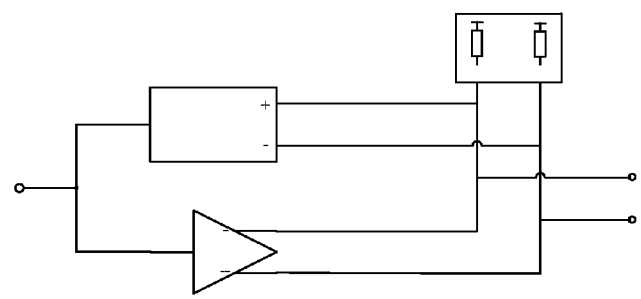
FIG. 4 shows a circuit schematic of a single-to-differential conversion circuit of a topology C.

A single-to-differential conversion circuit has many topologies, for example, a topology A in FIG. 2, in which single-to-differential conversion is implemented in a simple way. For example, "A 300-800 MHz Tunable Filter and Linearized LNA Applied in a Low-Noise Harmonic-Rejection RF-Sampling Receiver" adopts such a structure, which, however, faces difficulties in impedance matching and low noise figure. A topology B in FIG. 3 contains a type of single-to-differential conversion circuits composed by a common-gate and a common-source stage (CGCS). For example, "Wideband Balun-LNA With Simultaneous Output Balancing, Noise-Cancelling and Distortion-Cancelling", "A 0.46-mm2 4-dB NF Unified Receiver Front-End for Full-Band Mobile TV in 65-nm CMOS", and "A Wideband Low-Power Low-Noise Active Balun With Second-Order Distortion Cancellation", in which a forward Gm1 provides input wideband matching and and its noise can be cancelled to some extent, therefore achieving a low noise figure. "A 0.46-mm2 4-dB NF Unified Receiver Front-End for Full-Band Mobile TV in 65-nm CMOS" and "A Wideband Low-Power Low-Noise Active Balun With Second-Order Distortion Cancellation" improve the topology B through some feedback methods, thereby improving output balancing or second-order linearity. However, the topology B still faces trade-off in the requirement of balanced differential output, low noise and good input impedance matching. When noise performance and impedance matching are both achieved, the unbalanced output of differential signal makes it impossible to connect a load filtering circuit directly. A topology C in FIG. 4 includes a circuit structure similar to "A CMOS Active Feedback Balun-LNA With High IIP2 for Wideband Digital TV Receivers", which implements input matching and balanced differential output by differential-to-single-end-ended feedback, the disadvantage of the topology C is that the impedance at the output affects the input impedance, thus makes it impossible to connect filtering load directly.

EMBODIMENT

Figure 5:
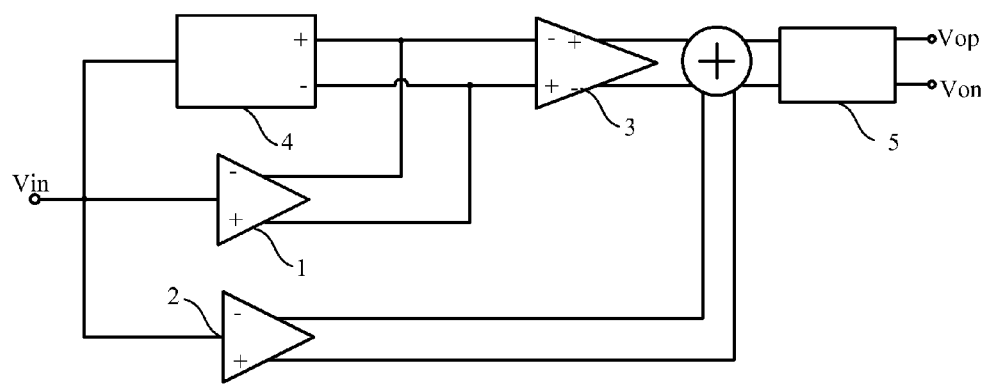
FIG. 5 shows a circuit schematic of a wideband low-noise amplifier having capability of single-to-differential conversion and a filtering effect consistent with the present invention.
Figure 6:
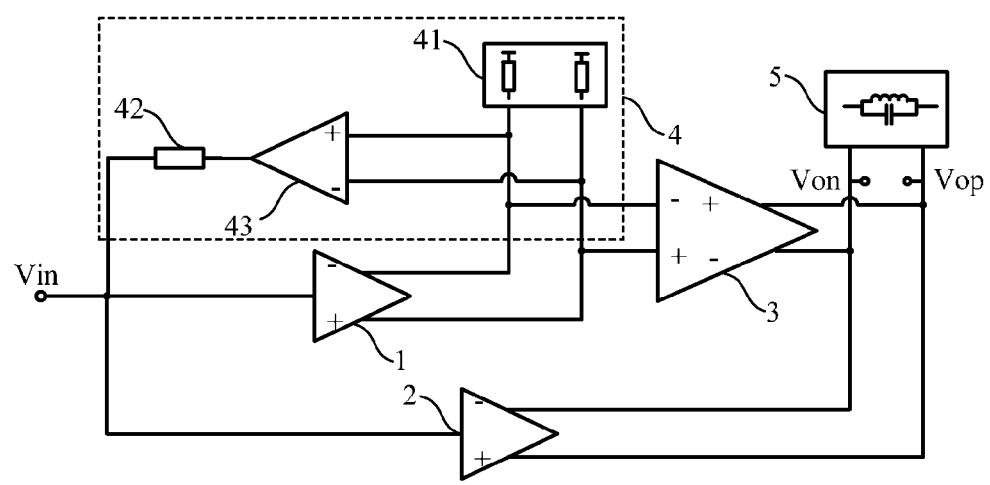
FIG. 6 shows a circuit schematic of a wideband low-noise amplifier having capability of single-to-differential conversion and a filtering effect including a specific feedback network consistent with the present invention.

This embodiment provides a wideband active Balun low-noise amplifier topology. As shown in FIG. 5, the wideband low-noise amplifier topology includes: a first transconductance stage 1, a second transconductance stage 2, a third transconductance stage 3, a feedback network 4, and a load 5. As shown in FIG. 6, the feedback network 4 includes a load 41, a feedback resistor 42 (Rfb), and a feedback amplifier 43 (Amp-fb). The connection relationship inside the wideband low-noise amplifier topology is as follows: the first transconductance stage 1 and the second transconductance stage 2 are connected in parallel, a single-end input of the first transconductance stage 1 connects to a voltage input Vin, a first output (negative output) of the first transconductance stage 1 connects to a first input (negative input) of the third transconductance stage 3, a second output (positive output) of the first transconductance stage 1 connects to a second input (positive input) of the third transconductance stage 3; a single-end input of the second transconductance stage 2 connects to the voltage input Vin, a first output (negative output) of the second transconductance stage 2 connects to a first output (negative output) of the third transconductance stage 3, a second output (positive output) of the second transconductance stage 2 connects to a second output (positive output) of the third transconductance stage 3; one end of the load 41 of the feedback network 4 connects to a first input (negative input) of the feedback amplifier 43, another end of the load 41 connects to a second input (positive input) of the feedback amplifier 43, an output of the feedback amplifier 43 connects to one end of the feedback resistor 42, and another end of the feedback resistor 42 connects to the voltage input. The first input (negative input) of the third transconductance stage 3 connects to the first output (negative output) of the first transconductance stage 1, the second input (positive input) of the third transconductance stage 3 connects to the second output (positive output) of the first transconductance stage 1, the first output of the third transconductance stage 3 connects to the first output of the second transconductance stage 2, the second output of the third transconductance stage 3 connects to the second output of the second transconductance stage 2; one end of the load 5 connects to the first output of the third transconductance stage 3, another end of the load 5 connects to the second output of the third transconductance stage 3. The first transconductance stage 1 and the second transconductance stage 2 are used to input voltages. The feedback network 4 is used to convert differential output signal of the first transconductance stage 1 into a single-end signal, and feeds it back to the single-end voltage input to form a feedback loop. The third transconductance stage 3 is used to convert a voltage output by the first transconductance stage 1 into a current. This current will be added to the current output by the second transconductance stage 2. The load 5 is used to receive the summed current from the third transconductance stage 3 and the second transconductance stage 2, and generate a narrowband differential voltage signal.

In this embodiment, via a single voltage input Vin, and by using the first transconductance stage 1 and the second transconductance stage 2 connected in parallel as input, in one aspect, a voltage signal, generated on the load 41 from a current output by the transconductance stage 1, passes through the feedback amplifier 43 and the feedback resistor 42 in the feedback network 4 and is converted from a differential signal into a single-ended signal, and the single-ended signal is fed back to the voltage input Vin to form a feedback circuit loop, thereby implementing wideband matching of the voltage input Vin. In another aspect, the current generated by the first transconductance 1 and the load 41, and output through the third transconductance 3 is added to the output current of the second transconductance stage 2, and such a current is filtered by the load 5 to generate a narrow-band differential voltage signal, thereby achieving single-stage wideband low-noise amplification and narrow-band filtering. The load 5 may be a passive narrow-band filter circuit or a frequency-dependent load circuit. Finally, a positive voltage and a negative voltage are output, thereby implementing single-end input and differential output.

The wideband active balun LNA topology provided in this embodiment has the following characteristics:

1. Two differential signals that enter the load 5 can connect to identical load. In addition, both of the second transconductance stage 2 and the third transconductance stage 3 have high output impedance, thus making it possible to directly connect a frequency-dependent load (e.g. a narrow-band filter circuit composed of an LC Tank circuit), or a post-stage load impedance (e.g. input impedance of a mixer) without introducing extra interface stages between low-noise amplification and narrow-band filtering stages, thereby improving the linearity performance and noise performance and saving power and die area.

2. The wideband active balun LNA topology can achieve both input impedance matching and narrow-band output filtering, which are isolated by the third transconductance stage 3 and thus do not affect the function of each other.

3. The wideband active balun LNA topology converts the single-end signal into differential signal in the first transconductance stage 1 and the second transconductance stage 2. The subsequent circuits, e.g. the third transconductance stage 3 and the load 5 can be designed to be fully differential circuits. In this case, as long as the first and second transconductance stages have great single-to-differential conversion performance, which is easy to achieve, the whole LNA circuit can accomplish single-to-differential conversion with balanced differential signal output with superior amplitude and phase matching.

4. The IIP2 performance of the whole circuit depends on second-order linearity of the first transconductance stage 1, the second transconductance stage 2, and the feedback network, because the third transconductance stage 3 and the load 5 which are fully differential circuits. Since it's easy to achieve superior and stable second-order linearity for the first and second transconductance stages and the feedback network if suitable circuit is adopted. Therefore, the amplifier of the present invention can achieve relatively desirable second-order linearity theoretically and practically.

5. It is found according to noise analysis that the output noise generated by transconductance stage 1 is transferred to the output by two paths. One is from the output of the first transconductance 1, passing through the third transconductance stage 3 to the output, the other is from the output of the first transconductance stage 1, passing through the feedback network 4 and the second transconductance stage 2 to the output. The phase shift of these two paths is just opposite from each other. In this way, the noise output by the first transconductance stage 1 can be cancelled under proper condition, and those transistors that work for impedance matching will contribute negligible noise. Thus the noise performance of the whole circuit is mainly determined by the second transconductance stage 2 because the noise from the third transconductance stage 3 is also attenuated due to previous amplification stage. In this case, the amplifier topology in the present invention can achieve a very low noise figure without affecting wideband impedance matching;

6. The wideband active balun LNA topology is completely symmetrical and therefore can be switched into a fully-differential mode at any time to achieve even better performance.

The wideband active balun LNA topology provided by the present invention has the following advantages: 1) in order to achieve lower overall noises and better linearity, a circuit structure achieving single-stage wideband low-noise amplification and LC filtering is configured at an RF input. In addition, the LNA topology in the present invention can implement single-to-differential conversion, wideband matching, narrow-band filtering simultaneously at a single stage with a very low noise figure and superior second-order linearity. 2) Differential noise cancellation is achieved in the single-to-differential conversion structure to avoid the influences on noise performance by impedance matching.

In conclusion, the present invention effectively overcomes various disadvantages in the prior art and has a high value in industrial application.

The principle and efficacy of the present invention are exemplarily described in the foregoing embodiments, which are not intended to limit the present invention. Any person skilled in the art could make modifications or alterations to the foregoing embodiments within the concept and scope of the present invention. Therefore, any equivalent modification or alteration made by a person of ordinary skilled in the technical field without departing from the concept and technical thinking disclosed by the present invention shall fall within the scope of the claims of the present invention.

What is claimed is:

1. A wideband active Balun low-noise amplifier topology comprises: a first transconductance stage, a second transconductance stage, a third transconductance stage, a feedback network, and a first load; wherein the first transconductance stage is in parallel to the second transconductance stage, a single-end input of the first transconductance stage connects to a voltage input, a first output of the first transconductance stage connects to a first input of the third transconductance stage, and a second output of the first transconductance stage connects to a second input of the third transconductance stage; a single-end input of the second transconductance stage connects to the voltage input, a first output of the second transconductance stage connects to a first output of the third transconductance stage, a second output of the second transconductance stage connects to a second output of the third transconductance stage; the first transconductance stage and the second transconductance stage are used to input voltages;

an output of the feedback network connects to the voltage input, a first input of the feedback network connects to the second output of the first transconductance stage, a second input of the feedback network connects to the first output of the first transconductance stage; and the feedback network is used to convert differential output signal of the first transconductance stage into a single-end signal, and feeds it back to the single-end voltage input to form a feedback loop;

the first input of the third transconductance stage connects to the first output of the first transconductance stage, the second input of the third transconductance stage connects to the second output of the first transconductance stage, the first output of the third transconductance stage connects to the first output of the second transconductance stage, the second output of the third transconductance stage connects to the second output of the second transconductance stage; and the third transconductance stage is used to convert a voltage output by the first transconductance stage into a current, and this current will be added to the a current output by the second transconductance stage; and one end of the first load connects to the first output of the third transconductance stage, another end of the first load connects to the second output of the third transconductance stage; and the first load is used to receive the summed current from the third transconductance stage and the second transconductance stage, and generate a narrow-band differential voltage signal.

2. The wideband active Balun low-noise amplifier topology according to claim 1, wherein the feedback network comprises a second load, a feedback resistor, and a feedback amplifier.

3. The wideband active Balun low-noise amplifier topology according to claim 2, wherein one end of the feedback resistor connects to the voltage input, and another end of the feedback resistor connects to an output of the feedback amplifier.

4. The wideband active Balun low-noise amplifier topology according to claim 2, wherein a first input of the feedback amplifier connects to one end of the second load, and a second input of the feedback amplifier connects to another end of the second load.

5. The wideband active Balun low-noise amplifier topology according to claim 2, wherein a voltage signal generated on the second load by the first transconductance stage feeds back to the voltage input through the feedback amplifier and the feedback resistor.

6. The wideband active Balun low-noise amplifier topology according to claim 1, wherein the first load is a passive narrow-band filter circuit or a frequency-dependent load circuit.

7. The wideband active Balun low-noise amplifier topology according to claim 1, wherein the output noise generated by the first transconductance stage is transferred to the output by two paths; one is from the output of the first transconductance, passing through the third transconductance to the output, the other is from the output of the first transconductance, passing through the feedback network and the second transconductance successively to the output; the phase shift of these two paths is just opposite from each other.

* * * * *